United States Patent
Looije

(10) Patent No.: US 8,431,912 B2
(45) Date of Patent: Apr. 30, 2013

(54) SIMULTANEOUS MEASUREMENT OF BEAMS IN LITHOGRAPHY SYSTEM

(75) Inventor: Alco Looije, Delft (NL)

(73) Assignee: Mapper Lithography IP B.V., Delft (NL)

(*) Notice: Subject to any disclaimer, the term of this patent is extended or adjusted under 35 U.S.C. 154(b) by 771 days.

(21) Appl. No.: 12/613,429

(22) Filed: Nov. 5, 2009

(65) Prior Publication Data

US 2010/0117001 A1     May 13, 2010

Related U.S. Application Data

(60) Provisional application No. 61/112,591, filed on Nov. 7, 2008.

(51) Int. Cl.
    *G21G 5/00*     (2006.01)
(52) U.S. Cl.
    USPC ............... 250/492.22; 250/492.1; 250/492.2; 250/492.3
(58) Field of Classification Search ..... 250/492.1–492.3
    See application file for complete search history.

(56) References Cited

U.S. PATENT DOCUMENTS 6,657,210 B1 * 12/2003 Muraki .................. 250/492.22
6,815,675 B1 * 11/2004 Lorusso et al. ............... 250/307

FOREIGN PATENT DOCUMENTS

JP     2004-200549     *   7/2004

OTHER PUBLICATIONS

Coyle et al., "Progress toward a raster multibeam lithography tool" Journal of Vacuum Science & Technology B, Mar. 1, 2004, 501-505, vol. 22, American Vacuum Society, New York, NY, U.S.

* cited by examiner

*Primary Examiner* — Michael Maskell
(74) *Attorney, Agent, or Firm* — Blakely, Sokoloff, Taylor & Zafman

(57) ABSTRACT

The present invention relates to a lithography system in which intensities of individually modulated beams from a multitude of beams are determined, comprising a measuring device with a sensor having a sensor area adapted for simultaneously sensing a plurality of beams and providing an aggregated signal thereof. The beams are individually modulated according to associated temporal blanking patterns. The present invention further relates to a method for calculating individual beam intensities dependent on the measured aggregated signal and the temporal blanking patterns of the beams.

22 Claims, 3 Drawing Sheets

SIMULTANEOUS MEASUREMENT OF BEAMS IN LITHOGRAPHY SYSTEM

This is a non-provisional application claiming the benefit of U.S. Provisional Application No. 61/112,591, filed Nov. 7, 2008.

BACKGROUND

The present invention relates to a lithography system in which intensities of individual beams from a multitude of beams are determined, comprising a measuring device with a sensor having a sensor area adapted for simultaneously sensing a plurality of beams and providing an aggregated signal thereof. The present invention further relates to a method for calculating such individual beam intensities dependent on the measured aggregated signal.

Exposure beams of charged particles, light and/or other types of radiation are being used in the industry, inter alia, in the manufacture of highly integrated and micro patterned semiconductor devices. Such semiconductor devices are usually formed on a semiconductor wafer on which layers of suitable materials are deposited, patterned and subsequently etched away according to a predetermined pattern. The exposure beams are often used in the patterning step. Portions of sacrificial material which are exposed to such a beam will be etched away in a following step, whereas portions that have not been exposed to a beam will remain, resulting in a pattern on for example a wafer.

In this process the dose of the exposure beams has to be accurately monitored and possibly adapted accordingly; if the dose is too low the sacrificial material will not react sufficiently and the sacrificial material will not be etched away in the following step, whereas if the dose is too high some part of the beam may spill over into areas which should not be exposed, resulting in a larger surface being etched away than desired. Both cases result in a pattern different from the intended pattern.

Unfavorably, the dosage of the beams reaching the sacrificial material is susceptible to changes over time due to for example changes in the beam source, alterations to the exposure system, changes in the pattern to be transferred, etc. There is a need therefore to be able to determine the dose of beams used in beam exposure systems. Preferably such a dose can be determined quickly for many beams, at or near the point where the exposure beam(s) hit the target.

For determining the dose of a charged particle (CP) beam or CP beams in a fast and reliable manner some solutions have already been proposed:

In JP2004-200549A a multiple-beam lithography system is described in which the absolute value of the total of the currents in all m×n matrix form electron beams is measured, by using a Faraday cup provided on a plane, and the relative value of each the m×n beams is measured using a semiconductor detector, or by using a combination of a scintillator and a photomultiplier, for the determination of reflected electrons or the secondary electrons. The relative current values, standardized for all the currents, are shown in a chart, and this enables at a glance the detection of anomalous values for improved reliability in the drawing motions to follow. The Faraday cup is used to accurately yet relatively slowly determine an absolute total current of either one or all electron beams which impinge thereon. The relative current measurement provides a relatively fast yet less accurate and relative representation of the current of one or more electron beams. From the relative currents for all individual electron beams estimates of the absolute currents for all individual electron beams can be made when the combined total current of all electron beams is known.

In US 2006/0,138,359 A1 ('359) a CP beam exposure apparatus is disclosed which splits a CP beam from a CP beam source into a plurality of CP beams by a plurality of apertures formed in an aperture array to execute exposure using the plurality of CP beams, the apparatus comprising:
 a detection unit which detects an intensity of the CP beam passing through the aperture of the aperture array, and
 a grid array which adjusts an intensity of the CP beam on the basis of the detection result obtained by said detection unit.

In an embodiment according to '359 the intensity of the beam or beams is measured at two levels in the exposure apparatus. First, for each individual beam or group of beams passing through the aperture array the intensity is measured. This is done by blanking out all other beams passing through the aperture array and positioning a Faraday cup close to the individual CP beam to measure the beam or group of beams to be measured. The Faraday cup is placed on or near the wafer surface in order to obtain a measurement of the beam or group of beams close to the wafer surface. The measured intensity for each beam or group of beams is stored in a memory and is used later on as a reference value.

Additional measurements of the beam intensity can be performed during the patterning phase of a target such as a wafer. The intensities of parts of the beam which are blocked by surfaces on the aperture array are measured, said surfaces being isolated from each other and associated with a single aperture or group of apertures. It is assumed that the intensity of a part of the CP beam being blocked by the surface surrounding the aperture is similar to that of a part of the CP beam which passes through the aperture. Thus it becomes possible to determine an approximate intensity of the plurality of CP beams which emerge from the aperture array based on the CP beam intensity measured on the associated blocking surfaces on the aperture array. The values obtained during these measurements are compared to the reference values and the system is adapted to maximize the uniformity of the CP beams emerging from the aperture array.

When using the above apparatus to measure actual individual beam intensities of beams emerging from the aperture array, the measuring device, in this case a Faraday cup, has to be brought into a position close to where the beam would reach the target during the patterning phase. This positioning of the measuring device has to be repeated for each beam out of the plurality of beams emerging from the aperture array, which takes time, and becomes especially impractical for systems in which thousands of beams have to be measured. Furthermore, the detecting surfaces on the aperture array which measure the approximate CP beam intensities at a point before reaching the level of a target have to be precisely aligned and are not allowed to interfere substantially with the CP beams. Precise alignment of the detecting surfaces necessitates a complex design. Moreover, when the apertures are very small, for instance to enable thousands of beams to emerge from the aperture array or to reach a high beam resolution, the CP beams may be influenced by electrical signals emitted by the detecting surfaces, making this approach impractical for systems in which thousands of individual CP beams are used.

Obviously there still is a need in the industry for a system and method for quickly determining the dose of each beam in a multitude (for example, tens of thousands) of beams which delays the manufacturing process for a minimum amount of time, preferably using only a single sensor.

SUMMARY OF THE INVENTION

To this end, according to a first aspect the present invention provides a multiple beam lithography system comprising: a beam source for providing a multitude of beams, a blanker array comprising a blanker for each beam out of the multitude of beams, said array adapted for substantially allowing a plurality of beams to pass through, a control device for providing the blanker array with a temporal blanking pattern indicating for each beam when it should be blanked and when not, thereby modulating each beam with an unique temporal blanking pattern, and a measuring device arranged downstream of the blanker array, comprising a sensor having a sensor area arranged for directly and simultaneously sensing the plurality of individually modulated beams for providing an aggregated signal of the plurality of beams. This embodiment allows for direct and simultaneous measurement of a plurality of beams, resulting in an aggregated signal. Advantageously, the sensor can remain in place during the measurement avoiding the need to spend time on realigning the sensor for measurement of an individual beam. A further advantage is that the sensor can be placed at the same level as a target which is to be exposed to the beams, thus allowing for measurements of the beams as they would hit a target such as a wafer. An additional advantage of simultaneously measuring a plurality of individual beams is good scalability without adding to the complexity of construction of the sensor. Because the sensor provides an aggregate signal instead of separate signals for each beam, elaborate wiring configurations as seen in the prior art can be omitted and the system can easily be made suitable for measuring additional beams by increasing the area of the sensor. It is thus possible to obtain an aggregate signal of a multitude (for instance, at least hundreds of thousands) of beams simultaneously. As only a single sensor is required space and maintenance requirements, as well construction complexity of the system are kept to a minimum. Moreover, as an aggregated intensity of a multitude of beams is measured, the dynamic range of the sensor may be smaller. Most importantly however the time needed for accurately measuring such an aggregate signal may be significantly less than the time needed for accurately measuring a much smaller intensity of an individual beam. The present embodiment may allow determination of individual beam intensities of 500.000 beams or more in about 10 seconds.

In an embodiment the system further comprises a demodulator adapted for demodulating said aggregated signal into an intensity value for each individual beam. The information about the temporal blanking patterns for all individual beams, together with the aggregated signal over time, provides enough information for the demodulator to deduce individual beam intensity values. Demodulation is possible because no two temporal blanking patterns of any two beams are equal. If the temporal blanking patterns of two beams were equal it would be impossible to derive from a series of aggregated signal measurements whether such two beams have respective intensities of 85% and 95%, or the same two beams have respective intensities of for instance 95% and 85%, or 100% and 80%.

In an embodiment the demodulator comprises an electronic data processor (113) adapted for providing the control device with said temporal blanking patterns and calculating a measure of the intensity of individual beams based on their corresponding temporal blanking patterns and the aggregated signal of the plurality of beams as a function of time. Typically, the temporal blanking patterns for the individual beams are stored in the memory of an electronic data processor such as a computer. The electronic data processor provides the control device with these patterns. In turn, the control device provides the blanker array with blanking patterns at predetermined times. Measurements of an aggregated intensity signal may be made and stored in the memory of the electronic data processor each time the blanker array is provided with a different pattern. Thus, when all measurements are done, sufficient information is available for the electronic data processor to calculate individual beam intensities. A method by which this may be done is described in following part of this document.

In an embodiment the sensor area is adapted for simultaneously sensing all beams of the multitude of beams of the system. It is often the case that the blankers in a blanker array are capable of only substantially blanking out a beam, for example a blanker might be capable of blanking out 99% of a beam, allowing 1% of the beam to pass through as a residual beam. A way to estimate the signal of a single residual beam is to measure the aggregate signal when none of the multitude of beams is blanked, the aggregate signal when all of the multitude of beams except one is blanked, and the signal contrast of the beam. Subtracting the second and third from the first provides the residual signal of the individual beam.

In an embodiment the sensor area is a contiguous area. When the sensor area adapted for simultaneously sensing all beams of the multitude of beams is contiguous alignment of the beams onto the sensor can be kept simple.

In an embodiment of the system, the multitude of beams comprises a multitude of charged particle beams, and the sensor comprises a current measuring device adapted for measuring an aggregated current generated by the plurality of beams. Advantageously, according to the present invention considerably less electrical wiring is necessary, especially in the sensor area, resulting in less undesirable deflection and/or dispersion of the charged particle beams used. The sensitivity of the charged particle beams to electrical fields can be used to an advantage at the blanker array; such a blanker array might comprise an array of apertures surrounded by photovoltaic cells. When such a cell is irradiated by light, a local current is generated around the aperture, suitable for deflecting a single beam. The entire blanking array can thus effectively be constructed without using electrical control lines, and can be controlled using light sources which do not interfere with the CP beams.

In an embodiment the current measuring device comprises one or more than one Faraday cup, current clamp and/or scintillating material and photon counter. Use of a Faraday cup offers the advantage of a simple sensor while the sensor itself is to a high extent insensitive to dispersion of backscattered CP beams. Furthermore measurements made using a Faraday cup provide a direct relation between the number of charged particles collected by the cup and the measured current generated by the Faraday cup. In case a current clamp or similar device is used to measure the current, the clamp can be used during the patterning phase as it does not block beams during measurement. When besides the number of charged particles the energies of the particles are of interest, a scintillating material such as an yttrium-aluminum-garnet crystal and photon counter may be used.

In an embodiment the system according to the invention further comprises a target positioning system comprising a stage for carrying and moving a target to be exposed to the beams, wherein the measuring device is mounted on the stage. When the measuring device is mounted on the stage the distance between beams and the measuring device during measurement can be made substantially equal to the distance between the beams and the target during the patterning phase, thus providing a good indication of the beam intensities as they would hit the target.

In an embodiment the system further comprises a converging means for directing the plurality of beams onto the sensor area. By directing the plurality of beams a much smaller sensor area can be used than would be possible if the individual beams were not allowed to combine, for example if specific sensor areas were assigned to corresponding beams. Preferably the converging means are located at the end of the optical column of the lithography system. In an embodiment the converging means are comprised in the measuring device.

In an embodiment the converging means comprise a converging element such as an optical or electrostatic lens.

In an embodiment the measuring device further comprises a knife edge or knife edge array placed in front of the sensor area. Using measurements obtained with this embodiment it is possible to calculate individual beam profiles in a manner analogous to the calculation of individual beam intensities.

In an embodiment the knife edge or knife edge array is placed substantially in an image plane of the system.

According to a second aspect the invention provides a multiple beam lithography system comprising a multiple beam column for projecting multiple beams onto a target, wherein the column comprises a beam source for providing a multitude of beams, a blanker array arranged between the beam source and the target, comprising a blanker for each beam out of the multitude of beams, wherein said array is adapted for substantially allowing a plurality of beams to pass through, a control device for providing the blanker array with a blanking pattern indicating for each beam when it should be blanked and when not, and projection means for projecting the plurality of beams onto the target, wherein the system further comprises a sensor arranged downstream of the multiple beam column for examining the throughput of the multiple beam column, wherein the sensor comprises a sensor area which is adapted for sensing all beams of the multitude of beams simultaneously, and wherein the sensor is arranged for providing an aggregated signal of the plurality of beams. This setup allows for accurate measurements of beam intensities using the same optics as would be used during patterning of a target. During measurement there is no need to use additional optics which might influence the measurements nor is there any no need to deflect the plurality of beams differently than would be appropriate during patterning of the target.

In a preferred embodiment the sensor area is placed on substantially the same level as the target. This results in highly accurate and realistic measurements of beam intensities as they would hit the target. In case the sensor comprises a Faraday cup, the entrance of the cup is preferably placed on substantially the same level as the target.

According to a third aspect the invention provides a method for simultaneous measurement of beams in a system as described herein, said method comprising the steps of:

i) providing a multitude of temporal blanking patterns comprising a temporal blanking pattern for each beam blanker, each temporal blanking pattern representing a modulation of an associated beam over a time interval, ii) simultaneously modulating the multitude of beams during the time interval by streaming to each blanker associated with a beam an associated temporal blanking pattern, sensing an aggregated beam intensity signal of all unblanked beams, and measuring said signal during the streaming of the temporal patterns as a function of time, iii) calculating a measure of the intensity of individual beams based on their associated temporal blanking patterns and the signal as a function of time. Using this method it becomes possible to calculate the intensities of individual beams from aggregate measurement made using only one sensor. The rate at which these individual intensities can be determined can be very high as there is no need to realign the sensor for each measurement of a beam. Additionally, the effects of residual signals on accuracy in the determination of the intensity of an individual beam is be reduced using this method when several beams are left unblanked at any time.

In an embodiment step iii) of the method comprises demodulating said signal by calculating a measure of the intensity of individual beams based on their associated temporal blanking patterns and the signal as a function of time.

In an embodiment the temporal blanking patterns are substantially orthogonal with respect to each other. A high degree of independence between the temporal blanking patterns makes the resulting aggregated signal easier to decode.

In an embodiment substantially only half of the multitude of beams is switched on during steps i) and ii). In this embodiment the range of the measured aggregated signal may be substantially reduced, allowing the use of more sensitive sensors with a smaller range, and allowing measurements to be performed more rapidly. Moreover, the influence of noise on the aggregated signal and the individual beam intensities derived there from is much less, as a slight variation in one individual beam intensity may substantially be cancelled out by a slight variation in another individual beam intensity.

In an embodiment the multitude of temporal blanking patterns is generated using pseudo random numbers. Throughout history, many methods for generating pseudo random numbers have been devised and many computer implemented random number generators have been extensively tested. One popular and well known method using linear feedback shift registers is disclosed in the publication "What is an LFSR?", by Texas Instruments, 1996, and is suitable for generating temporal blanking patterns. The high degree of irregularity of such blanking patterns makes them less susceptible to coincide with potential interference which might, for example, be present in the power supply of the measuring device and could affect the accuracy of the results. Additionally, a random element may be added to non-randomly generated temporal blanking patterns by replacing part or parts of such patterns by pseudo randomly generated patterns.

In an embodiment the temporal blanking patterns are derived from rows of an orthogonal matrix having orthogonal rows, such as a Hadamard matrix or a Walsh matrix. Using such matrices as a starting point large amounts of temporal blanking patterns can be generated.

In an embodiment the temporal blanking patterns are chosen such that each temporal blanking pattern contains a large number of on-off transitions. Advantageously, the influence of cyclic variations in the intensity of a beam on the aggregated signal may thus be reduced. Such cyclic variation may for instance be dependent on the frequency of the power source which powers the beam generator. When several sets of temporal blanking patterns are available, those sets in which the temporal blanking patterns for individual beams have the highest number of transitions are preferred.

In an embodiment the temporal blanking patterns are arranged such that at substantially any time the total amount of unblanked beams is substantially constant. In other words, at any time during measurement the number of beams in the plurality of beams reaching the sensor is substantially the same, allowing for a reduced dynamic range of the sensor.

In an embodiment the sensor comprises a current measuring device adapted for measuring an aggregated current generated by the plurality of beams, in which the current measuring device further comprises a variable gain amplifier which can be switched between a first setting comprising a high gain and low noise setting, and a second setting comprising a low gain and high noise setting, wherein said method comprises setting the variable gain amplifier to the first setting when the aggregate current is expected to be small, or setting the variable gain amplifier to the second setting when the aggregate current is expected to be large. By adapting the gain of the amplifier based on expected aggregated current (likely to be some factor times the number of beams passing through the blanker array), higher accuracy measurements can be obtained.

According to a fourth aspect the invention provides a measuring device suitable for use in a system described herein, said device comprising a sensor having a sensor area arranged for simultaneously sensing a plurality of beams for providing an aggregated signal of the plurality of beams, said measuring device further comprising a knife edge or knife edge array placed in front of the sensor area. The position of the beams on the knife edge of knife edge array can be controlled by deflecting the beams or by bringing the measuring device into a desired position. For each position of the knife edges any of the methods described herein can be used to derive a profile for each of the beams out of the multitude of beams.

The various aspects and features described and shown in the specification can be applied, individually, wherever possible. These individual aspects, in particular the aspects and features described in the attached dependent claims, can be made subject of divisional patent applications.

BRIEF DESCRIPTION OF THE DRAWINGS

The invention will be elucidated on the basis of an exemplary embodiment shown in the attached drawings, in which.

DETAILED DESCRIPTION OF THE INVENTION

Figure 1:
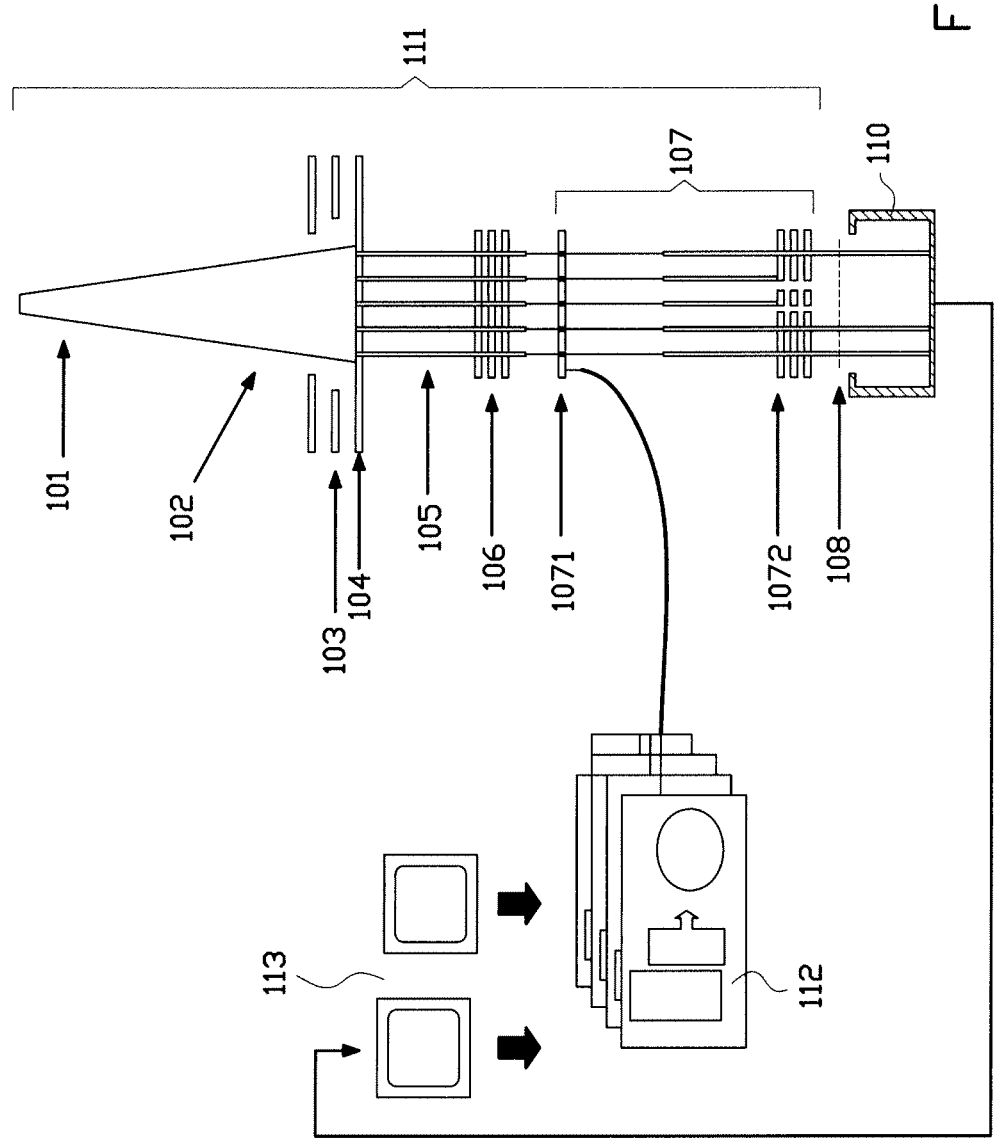
FIG. 1 shows a diagram of a multiple beam lithography system according to the invention.

In FIG. 1 a system according to the invention, is shown. A multitude of temporal blanking patterns is provided to a control device 112, by for example a computer or electronic data processor 113. A beam source 101 provides a beam 102, which passes through a collimator 103 which is adapted to transform the diverging beam 102 into a predominantly parallel beam. The resulting predominantly parallel beam is then projected onto and partially through an aperture array 104. The aperture array splits the beam into a multitude of beams 105, which emerge from the aperture array. A condenser lens 106 is used to condense the individual beams before they reach a beam blanker array 107. The blanker array is adapted for substantially letting through only a plurality of beams corresponding to temporal patterns which are streamed to it by control device 112. The blanker array comprises a deflector array 1071 and a further aperture array 1072 at a distance downstream of the deflector array 1071. Subsequently an aggregate signal of the plurality of beams measured by measuring device 110 is stored at the computer 113 for further processing according to a method of the invention. The computer 113 may thus be used to demodulate the aggregated signal once measurements are complete, i.e. the computer may be adapted to calculate a measure of the intensity of individual beams based on their associated temporal blanking patterns and the aggregated signal as a function of time. The location 108 at which the plurality of beams is imaged at substantially the same level or height as at which the beams would impact a target during the patterning phase.

Figure 2:
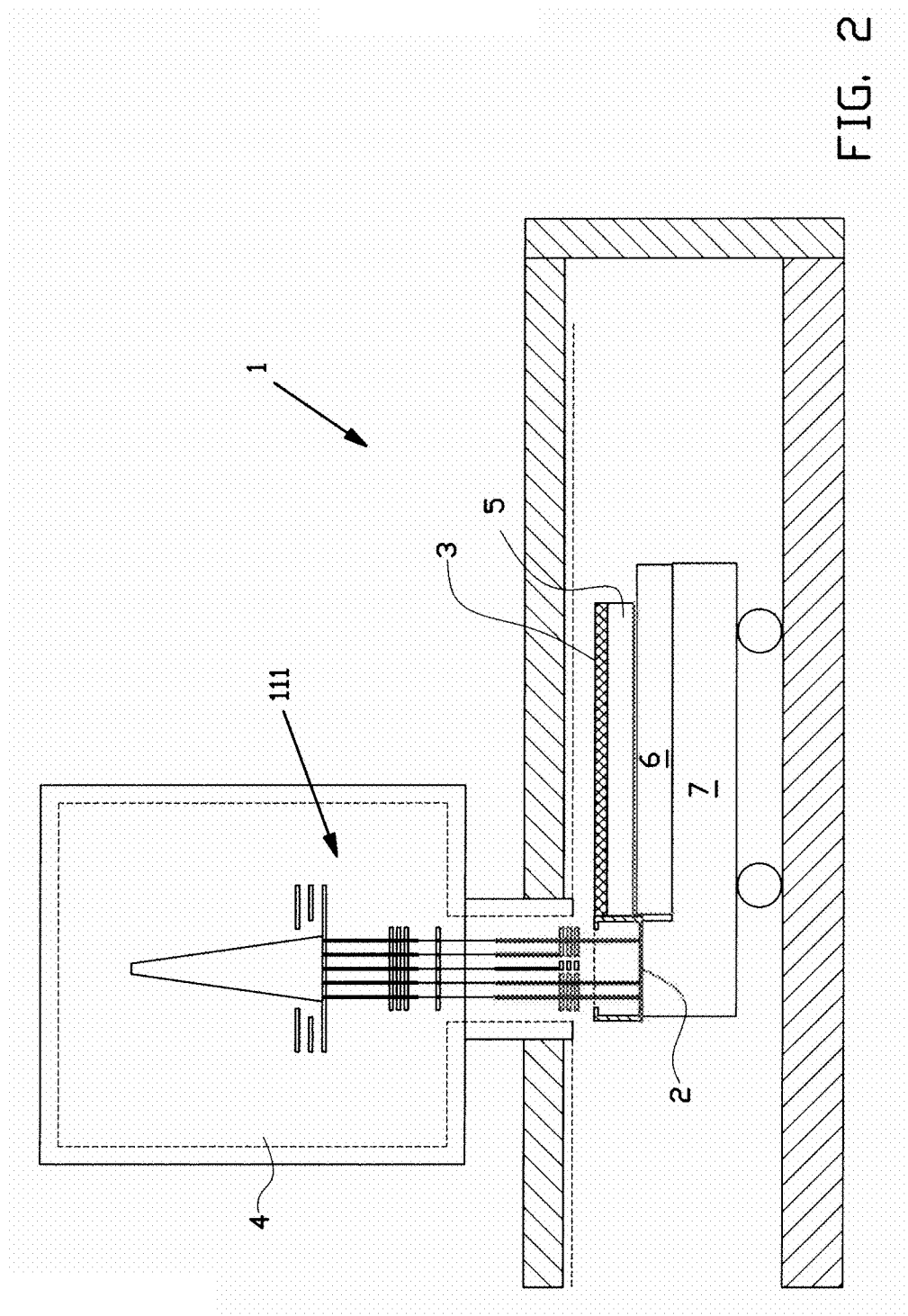
FIG. 2 shows a diagram of a cross section of a multiple beam lithography system including a target positioning system according to the invention.

FIG. 2 shows a cross sectional diagram of a multiple beam lithography system 1 including a target positioning system according to the invention. A target 3, for example a silicon wafer, is held on a target table 5 for holding the target. The target table is placed on y-translation stage 6 which in turn is placed on x-translation stage 7. The x-translation stage further includes a measuring device 2 comprising a sensor area positioned substantially at the same level as the target. An optical column 111, housed in a vacuum chamber 4, provide a plurality of beam. Whenever a new target is to be patterned, and a possible change in the dosage of individual beams out of a multitude of beams has to be monitored, the stage is brought into a position in which the measuring device can be reached by all beams for which the intensities have to be measured. After measurement and calculation of these individual beam intensities, said intensities may be adjusted accordingly, the stage is moved to position the target under the beams and the patterning of the target can start. The required sensor area for the measuring device can be reduced by using converging means to converge the plurality of beams before they reach the sensor area. Alternatively, the measuring device may comprise a knife edge array for determining a beam profile for each beam out of the multitude of beams. By calculating beam intensities of beams incident on the sensor for several different positions of the beams with respect to the knife edge array, individual beam profiles for each beam out of the multitude of beams can be obtained.

Figures 3, 4:
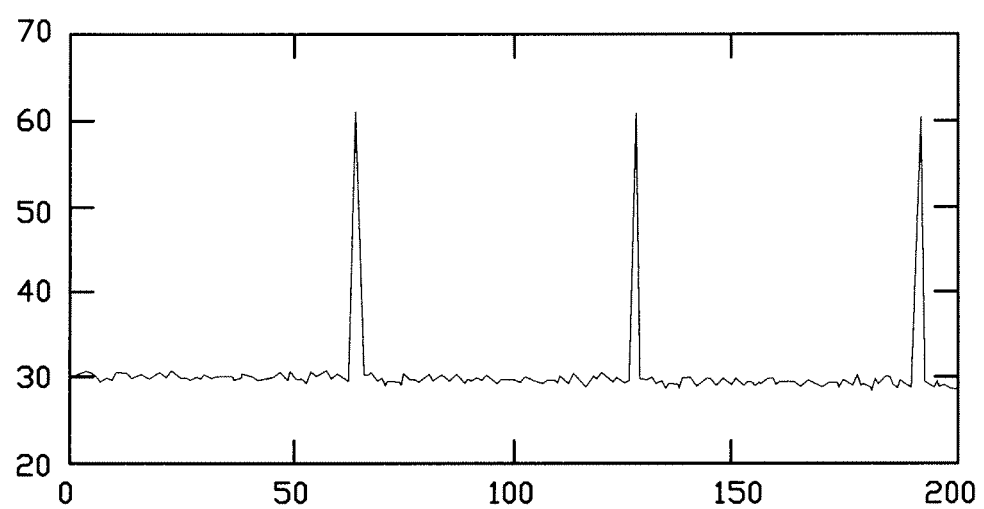
FIG. 3 shows a $4^{th}$ order Hadamard matrix of which the rows can be used as temporal blanking patterns.
FIG. 4 shows an example plot of a signal over time as obtained according to the invention.

In FIG. 3 an orthogonal matrix H of which the rows are used as temporal blanking patterns is shown. The matrix in question is a $4^{th}$ order Hadamard matrix, but, depending on the desired accuracy of the measurements, another square matrix can be used. For ease of calculation these matrices are preferably binary matrices. By way of example, suppose there are four beams having intensities:

$$i_b = (0.9, 1.3, 1.1, 0.8)$$

At each time interval n for which the control device streams a part of the temporal patterns to the blanker array, the aggregated signal $x_n$ measured by the measuring means will be:

$$x_n = (i_b \cdot H),$$

or, for the example in case:

$$x_n = (4.1, 0.3, -0.1, -0.7)$$

In practice the aggregated signals will also contain some noise. If the noise for the four measurements is modeled as:

$$e_n = (0.092, 0.067, -0.104, 0.007)$$

then the measured aggregated signal including noise will be:

$$X_n = x_n + e_n$$
$$= (4.192, 0.367, -0.204, -0.693)$$

To retrieve the contribution of the individual beams to the aggregated signals it suffices to calculate:

$$\hat{i}_b = (X_n \cdot H)/4$$
$$= (0.915, 1.364, 1.078, 0.834)$$

In this example a Hadamard matrix was used for reasons of clarity and simplicity though other kinds of square matrices having similar properties may be used, some offering additional advantages. In either case however the method advantageously makes use of the fact that, as all temporal blanking patterns have a inner product of substantially zero with the other temporal blanking patterns, the contribution of the all temporal blanking patterns to an aggregated signal except one can be filtered out by taking the inner product of that one temporal blanking pattern with the aggregated signal. In the example, the first element of the aggregated signal has a much higher value than the other elements, due to the sum of the first column of the matrix H being much greater than the sum of the subsequent column. If the first element of the aggregated signal is just ignored then the dynamic range of the measuring device can be significantly reduced at the cost of measuring one beam less. Alternatively, to reduce the dynamic range requirements for the measuring device, a matrix can be used in which all columns have a substantially equal sum. Temporal blanking patterns derived from rows of pseudo randomly generated matrices in particular offer desirable properties, such as improved rejection of interference and random noise during measurement, and reduced dynamic range of the measuring device allowing lower noise measurement devices to be used.

In FIG. 4 a graph is shown of the signal over time as used in the method according to the invention. The temporal blanker patterns that were used to obtain the signal consisted of rows of a $6^{th}$ order Hadamard matrix. The peaks in the signal are caused by the fact that the sum of the first column of the matrix is much greater than the sum of the other columns. Using these Hadamard matrix derived temporal blanking patterns, at the start of the measurement all beams pass through the blanker array, whereas at other times only half the beams pass through. The graph illustrates the improvement in dynamic range that can be achieved by measuring one beam less, and/or by using for instance a pseudo randomly generated matrix to derive the temporal blanking patterns from.

In summary the present invention relates to a lithography system in which intensities of individually modulated beams from a multitude of beams are determined, comprising a measuring device with a sensor having a sensor area adapted for simultaneously sensing a plurality of beams and providing an aggregated signal thereof. The beams are individually modulated according to associated temporal blanking patterns. The present invention further relates to a method for calculating individual beam intensities dependent on the measured aggregated signal and the temporal blanking patterns of the beams.

It is to be understood that the above description is included to illustrate the operation of the preferred embodiments and is not meant to limit the scope of the invention. From the above discussion, many variations will be apparent to one skilled in the art that would yet be encompassed by the spirit an scope of the present invention. For example, although the described embodiments all relate to charged particle beams the invention is also applicable to optical, such as extreme UV, lithography systems.

The invention claimed is:

1. Multiple beam lithography system comprising:
   a beam source for providing a multitude of beams,
   a blanker array comprising a blanker for each beam out of the multitude of beams, said array adapted for substantially allowing a plurality of beams to pass through,
   a control device for providing the blanker array with a temporal blanking pattern indicating for each beam when it should be blanked and when not, thereby modulating each beam with an unique temporal blanking pattern, and
   a measuring device arranged downstream of the blanker array, comprising a sensor having a sensor area arranged for directly and simultaneously sensing the plurality of individually modulated beams for providing an aggregated signal of the plurality of beams as a function of time.

2. Multiple beam lithography system according to claim 1, further comprising a demodulator adapted for demodulating said aggregated signal into an intensity value for each individual beam.

3. Multiple beam lithography system according to claim 2, wherein the demodulator comprises an electronic data processor adapted providing the control device with said temporal blanking patterns and for calculating a measure of the intensity of individual beams based on their corresponding temporal blanking patterns and the aggregated signal of the plurality of beams as a function of time.

4. System according claim 1, wherein the sensor area is arranged for simultaneously sensing all beams of the multitude of beams of the system.

5. System according to claim 1 or 4, in which the sensor area is a contiguous area.

6. System according to claim 1, wherein the multitude of beams comprises a multitude of charged particle beams, and the measuring device comprises a current measuring sensor arranged for measuring an aggregated current generated by the plurality of beams.

7. System according to claim 6, wherein the current measuring sensor comprises one or more than one Faraday cup, current clamp and/or scintillating material and photon counter.

8. System according to claim 1, further comprising a target positioning system comprising a stage for carrying and moving a target to be exposed to the beams, wherein the measuring device is mounted on the stage.

9. System according to claim 1, further comprising a converging element for directing the plurality of beams onto the sensor area.

10. System according to claim 1, in which the measuring device further comprises a knife edge or knife edge array placed in front of the sensor area.

11. System according to claim 10, in which the knife edge or knife edge array is placed substantially in an image plane of the system.

12. Method for simultaneous measurement of a multitude of beams in a system according to claim 1,
   said method comprising the steps of:
   i) providing a multitude of temporal blanking patterns comprising a temporal blanking pattern for each blanker, each temporal blanking pattern representing a modulation of an associated beam over a time interval,
   ii) modulating the multitude of beams during the time interval by streaming to each blanker associated with a beam an associated temporal blanking pattern, sensing an aggregated beam intensity signal of all unblanked beams, and measuring said signal during the streaming of the temporal patterns as a function of time, iii) calculating a measure of the intensity of individual beams based on their associated temporal blanking patterns and the signal as a function of time.

13. Method according to claim 12, wherein step iii) comprises demodulating said signal by calculating a measure of the intensity of individual beams based on their associated temporal blanking patterns and the signal as a function of time.

14. Method according to claim 12, wherein the temporal blanking patterns of said multitude of beams are substantially orthogonal with respect to each other.

15. Method according to claim 12, wherein during steps i) and ii) substantially only half of the multitude of beams is switched on.

16. Method according to claim 14, wherein the multitude of temporal blanking patterns is generated using pseudo random numbers.

17. Method according to claim 12, wherein the temporal blanking patterns are chosen such that each temporal blanking pattern contains a large number of on-off transitions.

18. Method according to claim 12, wherein the temporal blanking patterns are arranged such that at substantially any time the total amount of unblanked beams is substantially constant.

19. Method according to claim 12, wherein the measuring device comprises a current measuring sensor arranged for measuring an aggregated current generated by the plurality of beams as a function of time, in which the measuring device further comprises a variable gain amplifier which can be switched between
   a first setting comprising a high gain and low noise setting, and
   a second setting comprising a low gain and high noise setting,
   wherein said method comprises the step of setting the variable gain amplifier to the first setting when the aggregate current is expected to be small, or setting the variable gain amplifier to the second setting when the aggregate current is expected to be large.

20. Measuring device suitable for use in a system according to claim 1, said device comprising a sensor having a sensor area arranged for simultaneously sensing a plurality of beams for providing an aggregated signal of the plurality of beams, further comprising a knife edge or knife edge array placed in front of the sensor area.

21. Multiple beam lithography system comprising a multiple beam column for projecting multiple beams onto a target, wherein the column comprises:
   a beam source for providing a multitude of beams,
   a blanker array arranged between the beam source and the target, comprising a blanker for each beam out of the multitude of beams, wherein said array is adapted for substantially allowing a plurality of beams to pass through,
   a control device for providing the blanker array with a blanking pattern indicating for each beam when it should be blanked and when not,
   projection means for projecting the plurality of beams onto the target,
   a sensor arranged downstream of the multiple beam column for examining the throughput of the multiple beam column, wherein the sensor comprises a sensor area which is adapted for sensing all beams of the multitude of beams simultaneously, and wherein the sensor is arranged for providing an aggregated signal of the plurality of beams as a function of time, and
   a demodulator adapted for demodulating said aggregated signal by calculating a measure of the intensity of individual beams based on their corresponding temporal blanking patterns and the aggregated signal of the plurality of beams as a function of time.

22. Method according to claim 12, wherein several beams are left unblanked at any time.

* * * * *